(12) United States Patent
Feng et al.

(10) Patent No.: US 12,062,831 B2
(45) Date of Patent: Aug. 13, 2024

(54) DISPLAY MODULE AND DISPLAY DEVICE

(71) Applicants: Beijing BOE Sensor Technology Co., Ltd., Beijing (CN); BOE TECHNOLOGY GROUP CO., LTD., Beijing (CN)

(72) Inventors: Chunnan Feng, Beijing (CN); Wei Wang, Beijing (CN); Bin Liu, Beijing (CN); Shuo Li, Beijing (CN); Changbo Liu, Beijing (CN); Chuncheng Che, Beijing (CN); Zhifeng Zhang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/641,138

(22) PCT Filed: Apr. 27, 2021

(86) PCT No.: PCT/CN2021/090080
§ 371 (c)(1),
(2) Date: Mar. 8, 2022

(87) PCT Pub. No.: WO2022/226752
PCT Pub. Date: Nov. 3, 2022

(65) Prior Publication Data
US 2024/0047851 A1 Feb. 8, 2024

(51) Int. Cl.
*H01Q 1/22* (2006.01)
*H01Q 1/38* (2006.01)
*H10K 59/131* (2023.01)
*H10K 59/90* (2023.01)

(52) U.S. Cl.
CPC ............... *H01Q 1/22* (2013.01); *H01Q 1/38* (2013.01); *H10K 59/131* (2023.02); *H10K 59/90* (2023.02)

(58) Field of Classification Search
CPC .......... H01Q 1/22; H01Q 1/38; H10K 59/131; H10K 59/90
See application file for complete search history.

(56) References Cited

U.S. PATENT DOCUMENTS

| | | | |
|---|---|---|---|
| 2012/0133597 A1 | 5/2012 | Chen | |
| 2012/0299863 A1* | 11/2012 | Yilmaz | G06K 19/07758 |
| | | | 345/174 |
| 2019/0220123 A1* | 7/2019 | Kanaya | H10K 59/40 |

FOREIGN PATENT DOCUMENTS

| | | |
|---|---|---|
| CN | 105224136 A | 1/2016 |
| CN | 105446526 A | 3/2016 |
| CN | 109597252 A | 4/2019 |
| CN | 110212285 A | 9/2019 |

(Continued)

*Primary Examiner* — Dieu Hien T Duong
(74) *Attorney, Agent, or Firm* — HOUTTEMAN LAW LLC

(57) ABSTRACT

The present disclosure provides a display module and a display device, which belong to the field of display technology. The display module includes a display substrate, a flexible printed circuit board, and a near field communication antenna. The display substrate has a display region and a peripheral region; and at least a part of structure of the near field communication antenna is located in the peripheral region of the display substrate and on the flexible printed circuit board.

15 Claims, 6 Drawing Sheets

(56) References Cited

FOREIGN PATENT DOCUMENTS

| CN | 111045548 A | 4/2020 |
|---|---|---|
| CN | 112462560 A | 3/2021 |
| WO | WO 2018147109 A1 | 8/2018 |

* cited by examiner

DISPLAY MODULE AND DISPLAY DEVICE

TECHNICAL FIELD

The present disclosure relates to the field of display technology, and specifically relates to a display module and a display device.

BACKGROUND

Near Field Communication (NFC) technology is a non-contact identification and interconnection technology that adopts a near field magnetic field communication mode, which has the characteristics of short transmission distance, low energy consumption, resistance to signal interference and the like, and can achieve near field wireless communication between mobile devices and consumer electronic products.

The near field communication technology has been generally applied to electronic devices for data exchange, and in order to utilize the NFC technology, a communication antenna needs to be installed on an electronic device to transmit and receive electromagnetic wave signals, but the communication antenna will occupy a relatively large space. Current electronic devices mostly utilize the NFC technology by providing an independent NFC module external to a motherboard of each of the electronic devices, and thus each occupy a relatively large space, which is unfavorable for a lightweight design of the electronic device.

SUMMARY

To solve at least one of problems in the existing art, the present disclosure provides a display module and a display device.

In a first aspect, an embodiment of the present disclosure provides a display module, including a display substrate, a flexible printed circuit board, and a near field communication antenna; where the display substrate has a display region and a peripheral region; and at least a part of structure of the near field communication antenna is located in the peripheral region of the display substrate and on the flexible printed circuit board.

In some implementations, the display substrate includes a first base; the flexible printed circuit board includes a second base; the near field communication antenna includes a first wire and a second wire which are electrically connected; the first wire is located in the peripheral region and disposed on the first base; and the second wire is disposed on the second base.

In some implementations, the display module further includes an adapter board; and the first wire is electrically connected to the second wire through the adapter board.

In some implementations, the adapter board includes a chip on film adapter board.

In some implementations, the near field communication antenna further includes a first lead terminal and a second lead terminal on the flexible printed circuit board; the second base includes a first surface and a second surface which are opposite to each other; the second wire is disposed on the first surface; a first end of the first wire is connected to a first end of the second wire; a second end of the first wire is connected to the first lead terminal; and a second end of the second wire is connected to the second lead terminal.

In some implementations, the display substrate further has a first bonding region on a side of the peripheral region away from the display region; the adapter board includes a second bonding region and a third bonding region; and the flexible printed circuit board includes a fourth bonding region;

a first connection pad and a second connection pad are provided in the first bonding region; a third connection pad and a fourth connection pad are provided in the second bonding region; a fifth connection pad and a sixth connection pad are provided in the third bonding region; and a seventh connection pad and an eighth connection pad are provided in the fourth bonding region;

the first end of the first wire is connected to the first connection pad which is bonded with and connected to the third connection pad; the third connection pad is connected to the fifth connection pad through a first connection lead; and the first end of the second wire is connected to the seventh connection pad which is bonded with and connected to the fifth connection pad; and the second end of the first wire is connected to the second connection pad which is bonded with and connected to the fourth connection pad; the fourth connection pad is connected to the sixth connection pad through a second connection lead; and the sixth connection pad is bonded with and connected to the eighth connection pad which is connected to the first lead terminal.

In some implementations, a magnetic material layer is disposed on a side of the second wire away from the first surface; and the magnetic material layer covers the second wire.

In some implementations, the second base includes a first surface and a second surface which are opposite to each other; the second wire includes a first sub-wire and a second sub-wire on the first surface, and a third sub-wire on the second surface; and the near field communication antenna further includes a first lead terminal and a second lead terminal on the flexible printed circuit board;

a first end of the first wire is connected to a first end of the first sub-wire; a second end of the first wire is connected to a first end of the third sub-wire through a first via penetrating through the second base; a second end of the third sub-wire is connected to a first end of the second sub-wire through a second via penetrating through the second base; a second end of the first sub-wire serves as the first lead terminal; and a second end of the second sub-wire segment serves as the second lead terminal.

In some implementations, the display substrate further has a first bonding region on a side of the peripheral region away from the display region; the adapter board includes a second bonding region and a third bonding region; and the flexible printed circuit board includes a fourth bonding region;

a first connection pad and a second connection pad are provided in the first bonding region; a third connection pad and a fourth connection pad are provided in the second bonding region; a fifth connection pad and a sixth connection pad are provided in the third bonding region; and a seventh connection pad and an eighth connection pad are provided in the fourth bonding region;

the first end of the first wire is connected to the first connection pad which is bonded with and connected to the third connection pad; the third connection pad is connected to the fifth connection pad through a first connection lead; and the first end of the first sub-wire is connected to the seventh connection pad which is bonded with and connected to the fifth connection pad; and the second end of the first wire is connected to the second connection pad which is bonded with and connected to the fourth connection pad; the fourth connection pad is connected to the sixth connection pad through a second connection lead; and the sixth connection pad is bonded with and connected to the eighth connection pad which is connected to the first end of the third sub-wire through a first via penetrating through the second base.

In some implementations, orthographic projections of the first sub-wire and the second sub-wire on the second base overlap an orthographic projection of the third sub-wire on the second base.

In some implementations, a magnetic material layer is disposed on a side of the first sub-wire and the second sub-wire away from the first surface; and the magnetic material layer covers the first sub-wire and the second sub-wire; and/or a magnetic material layer is disposed on a side of the third sub-wire segment away from the second surface; and the magnetic material layer covers the third sub-wire segment.

In some implementations, the first lead terminal extends in a direction the same as that in which the second lead terminal extends.

In some implementations, the near field communication antenna includes a plurality of first wires and a plurality of second wires, and each of the first wires is connected to one of the second wires so that a group of sub-coils is formed, the sub-coils are connected in parallel and each have a first end connected to the first lead terminal, and a second end connected to the second lead terminal.

In some implementations, the display substrate further includes a metal layer on the first base; the metal layer includes a first part in the display region and a second part in the peripheral region; and the second part includes the first wire.

In some implementations, the metal layer includes a first metal layer and a second metal layer; the first wire includes a first conductive sub-wire and a second conductive sub-wire which are arranged in a stack and electrically connected;

the first metal layer includes the first conductive sub-wire and a gate line in the display region; and the second metal layer includes the second conductive sub-wire and a data line in the display region.

An embodiment of the present disclosure further provides a display device, including the display module as described above.

BRIEF DESCRIPTION OF DRAWINGS

FIG. 4 is a cross-sectional view taken along A-A' of FIG. 1a.

FIG. 5 is a cross-sectional view taken along B-B' of FIG. 1a.

FIG. 7 is a cross-sectional view taken along C-C' of FIG. 4a.

DETAIL DESCRIPTION OF EMBODIMENTS

To improve understanding of the technical solution of the present disclosure for those skilled in the art, the present disclosure will be described in detail with reference to accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components. Also, the use of the terms "a", "an", or "the" and similar referents do not denote a limitation of quantity, but rather denote the presence of at least one. The word "comprising" or "including" or the like means that the element or item preceding the word contains elements or items that appear after the word or equivalents thereof, but does not exclude other elements or items. The terms "connected" or "coupled" or the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may be changed accordingly.

Figure 1:
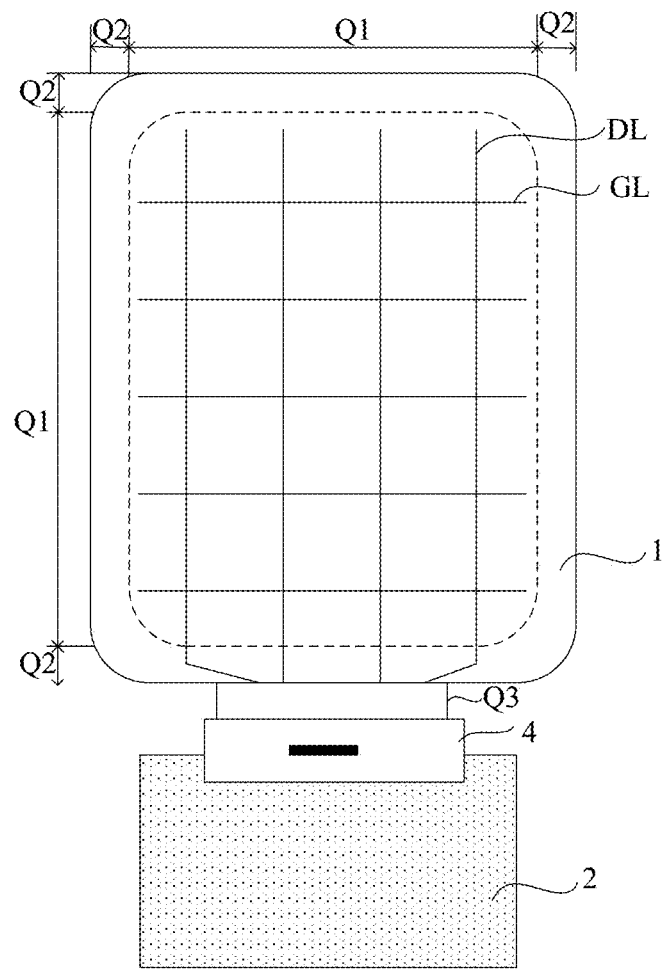
FIG. 1 is a schematic diagram of an exemplary display module.

As shown in FIG. 1, in an example, the display module includes a display panel, a chip on film (COF) adapter board, and a flexible printed circuit board (FPCB) 2. The display panel includes a display substrate 1 and an opposite substrate which are aligned and assembled into a cell. The display substrate 1 is connected to the flexible printed circuit board 2 through the chip on film adapter board 4. The display substrate 1 has a display region Q1 and a peripheral region Q2. For example, the display substrate 1 is provided with a plurality of gate lines each extending in an X direction and a plurality of data lines each extending in a Y direction. The gate lines are electrically connected to a driving circuit (DC) in the peripheral region Q2. The gate lines intersect with the data lines to define a plurality of pixel regions, each of which is provided with a pixel P each having an organic light-emitting element, such as an organic light-emitting diode (OLED). Since light emitted from the organic light-emitting diode can be used to display an image, an area where the pixel regions are located is defined as the display region Q1. The peripheral region Q2 is arranged outside the display region Q1. For example, the peripheral region Q2 may surround at a periphery of the display region Q1, and the peripheral region Q2 is a non-display region that cannot display an image.

Figure 2:
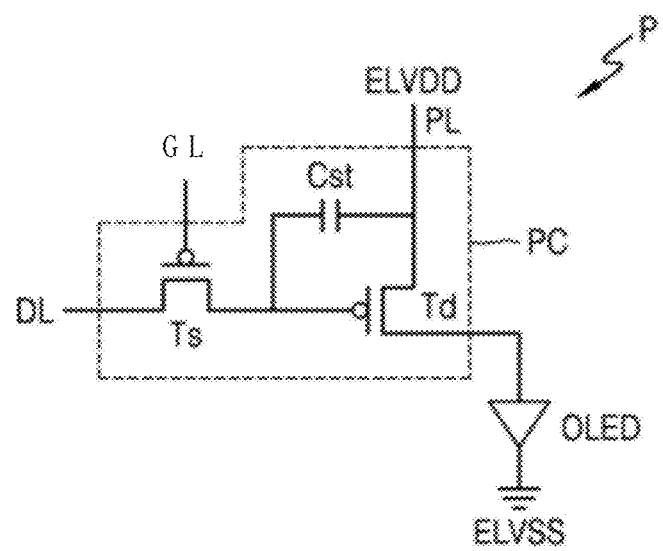
FIG. 2 is a diagram of a pixel circuit.

As shown in FIG. 2, each pixel P includes a pixel circuit PC connected to the gate line GL and the data line DL corresponding to the pixel P, and an organic light-emitting diode OLED connected to the pixel circuit PC. The pixel circuit PC includes a driving thin-film transistor (TFT) Td, a switch transistor Ts, and a storage capacitor Cst. The switch transistor Ts is connected to the gate line GL and the data line DL, and is configured to transmit, according to a scanning signal received through the gate line GL, a data signal received through the data line DL to the driving transistor Td. The storage capacitor Cst is connected to the switch transistor Ts and a driving voltage line PL, and is configured to store a voltage corresponding to a difference between a voltage received from the switch transistor Ts and a driving voltage ELVDD supplied to the driving voltage line PL. The driving transistor Td is connected to the driving voltage line PL and the storage capacitor Cst, and may be configured to control, according to a value of voltage stored in the storage capacitor Cst, a drive current flowing from the driving voltage line PL to the organic light-emitting diode OLED. The organic light-emitting diode OLED can emit light having a desired luminance under the drive current. The organic light-emitting diode OLED may emit, for example, red, green, blue or white light. Although a case where the pixel P includes two TFTs and one storage capacitor Cst is illustrated in FIG. 2, exemplary implementations of the present disclosure may employ other different configurations including a transistor and a storage element. In other implementations, the pixel circuit PC of the pixel P may include three or more transistors, and/or two or more storage capacitors.

As shown in FIG. 1, the display substrate 1 further includes a first bonding region Q3 located at a side of the peripheral region Q2 away from the display region Q1. For example, as shown in FIG. 1, the first bonding region Q3 is located on one side of the display region Q1, and has a pad region WA including a plurality of connection pads (or contact pads) each configured to be electrically connected to a signal line extending from the display region Q1 or the peripheral region. The contact pads may be exposed on a surface of the first bonding region Q3, i.e., not covered by any layer, so as to facilitate to be electrically connected to the chip on film adapter board 4 and thus to be electrically connected to the flexible printed circuit board 2. The flexible printed circuit board 2 is electrically connected to an external controller, and configured to transmit signals or power from the external controller. For example, the connection pads are electrically connected to data connection lines (which are electrically connected to the data lines in the display region Q1). The connection pads are electrically connected to the respective signal lines, which enables mutual communication between the signal lines and the flexible circuit board. The number and arrangement of the connection pads are not particularly limited here, and may be set according to actual needs. When the display module is assembled, the chip on film adapter board 4 and the flexible printed circuit board 2 need to be folded to a back side of the display panel (generally, a display side of the flexible display panel is default to be a front side, and the side opposite to the display side is default to be a rear side or back side). In this manner, an improved space utilization rate can be achieved, and an area occupied by the non-display region can be reduced.

The NFC technology has been generally applied to electronic devices for data exchange, and in order to utilize the NFC technology, a communication antenna needs to be installed on an electronic device to transmit and receive electromagnetic wave signals, but the communication antenna will occupy a relatively large space. Current electronic devices mostly utilize the NFC technology by providing an independent NFC module external to a motherboard of each of the electronic devices, and thus each occupy a relatively large space, which is unfavorable for a lightweight design of the electronic device.

In view of above, an embodiment of the present disclosure provides a display module, where a coil is integrated on a display substrate 1 and a flexible printed circuit board 2 of the display module, thereby implementing an integrated design of an NFC antenna and the display module, which is beneficial to saving space and obtaining a lightweight design of the display module.

The display module according to the embodiment of the present disclosure will be described below with reference to the accompanying drawings and specific implementations.

An embodiment of the present disclosure provides a display module, including a display substrate 1, an adapter board, a flexible printed circuit board 2, and a near field communication antenna. In the embodiment of the present disclosure, the adapter board includes, but is not limited to, a chip on film adapter board 4. However, due to the characteristics of the chip on film adapter board 4, such as flexibility, foldability and possibility to reduce scratches on the display module, the embodiment of the present disclosure is illustrated by taking the adapter board being the chip on film adapter board 4 as an example. The display substrate 1 is connected to the flexible circuit board through the chip on film adapter board 4. The display substrate 1 has a display region Q1 and a peripheral region Q2. At least a part of structure of the near field communication antenna is integrated in the peripheral region Q2 of the display substrate 1 and on the flexible printed circuit board 2.

In the embodiment of the present disclosure, by integrating the near field communication antenna in the peripheral region Q2 of the display substrate 1 and on the flexible printed circuit board 2, it is beneficial to saving space and obtaining a lightweight design of the display module. Meanwhile, since the peripheral region Q2 of the display substrate 1 and the flexible printed circuit board 2 both belong to non-display regions, the display effect of the display module will not be affected when the near field communication antenna is integrated in the display module.

In order to make the specific structure of the display module according to the embodiment of the present disclosure clearer, the following description is made with reference to specific examples.

Figure 3A:
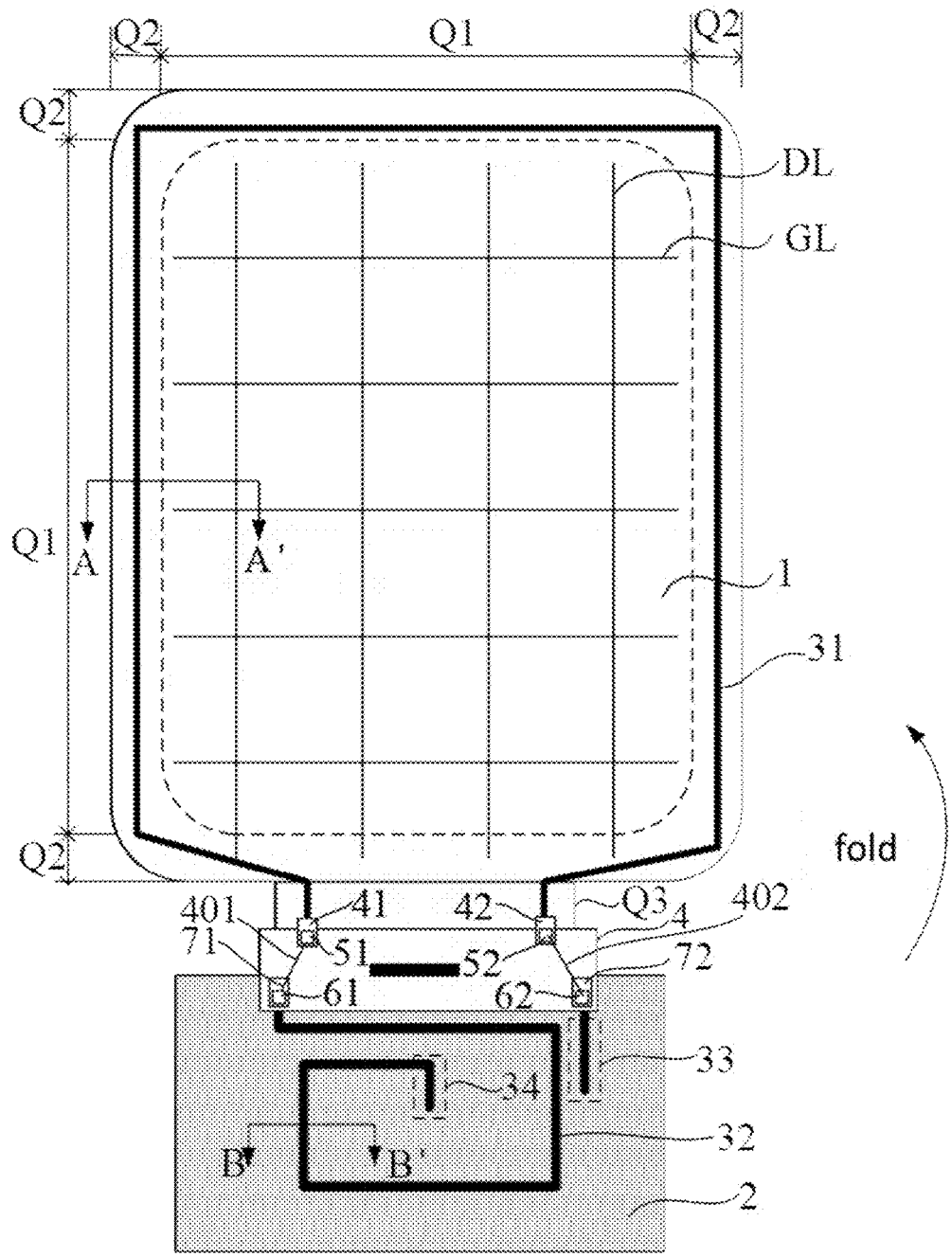
FIG. 3a is a top view of a display module according to an embodiment of the present disclosure with a flexible circuit board unfolded.
Figure 3B:
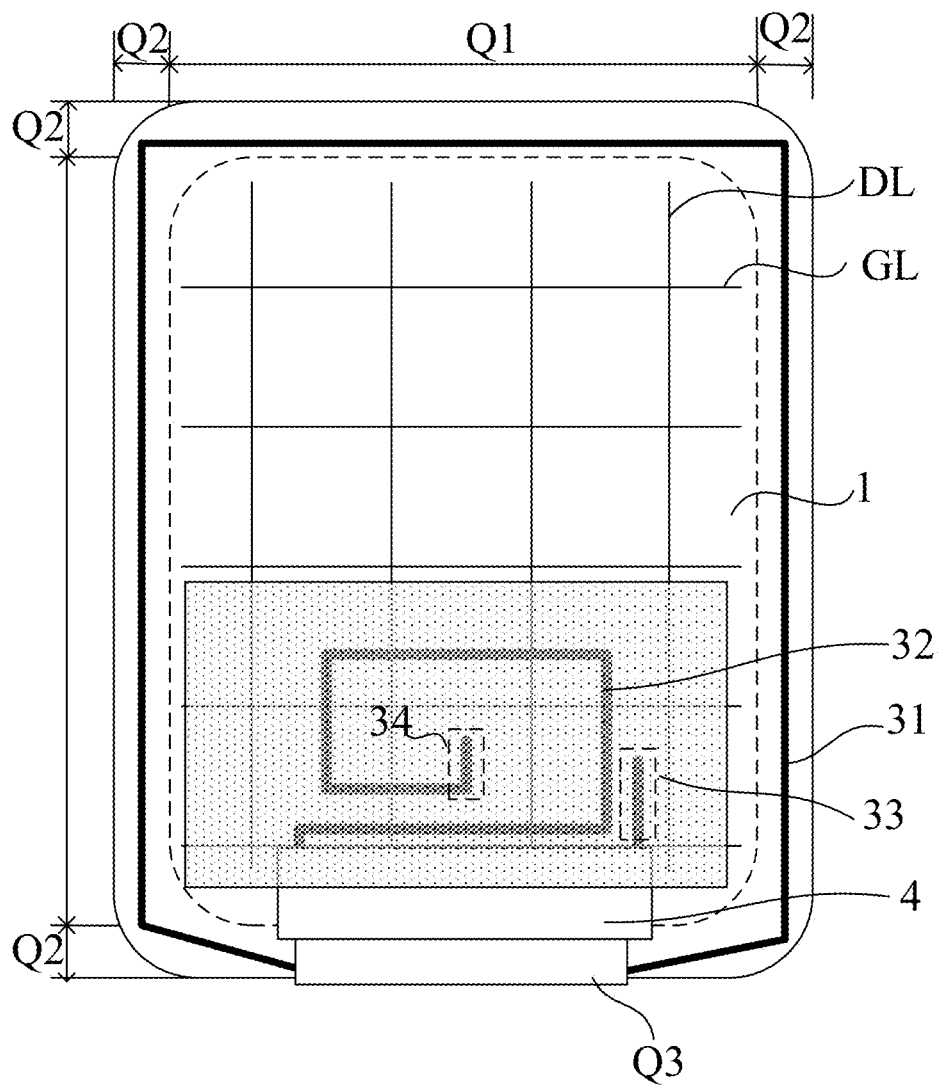
FIG. 3b is a top view of a display module according to an embodiment of the present disclosure with a flexible circuit board folded.
Figure 4:
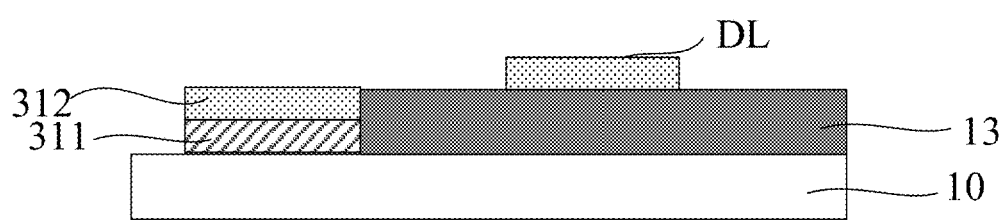
Figure 5:
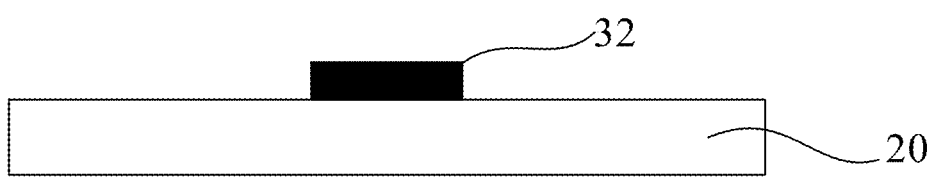

In a first example, FIG. 3a is a top view of a display module according to an embodiment of the present disclosure with a flexible circuit board unfolded; FIG. 3b is a top view of a display module according to an embodiment of the present disclosure with a flexible circuit board folded; FIG. 4 is a cross-sectional view taken along A-A' of FIG. 1a; and FIG. 5 is a cross-sectional view taken along B-B' of FIG. 1a. As shown in FIGS. 3a, 3b, 4 and 5, in the display module, the near field communication antenna includes a first wire 31 and a second wire 32 connected in series, and a first lead terminal 33 and a second lead terminal 34. The display substrate 1 includes a first base 10. The flexible printed circuit board 2 includes a second base 20 having a first surface and a second surface which are opposite to each other. In the embodiment of the present disclosure, a case where the flexible printed circuit is folded to the back side of the display panel, and the second surface is closer to the first base 10 than the first surface is as an example for illustration. The first wire 31 is disposed on the first base 10 and surrounds at a peripheral region Q2 of the display substrate 1; the second wire 32 is disposed on the first surface of the second base 20; and the first lead terminal 33 and the second lead terminal 34 are both disposed on the second base 20. A first end of the first wire 31 is connected to a first end of the second wire 32, and a second end of the first wire 31 is connected to the first lead terminal 33; and a second end of the second wire 32 is connected to the second lead terminal 34. The first lead terminal 33 and the second lead terminal 34 may be connected to a control circuit so that the near field communication antenna and the control circuit form a closed loop, and an induced current loop may be formed in the near field communication antenna and the control circuit through an external magnetic induction coil, thereby completing the near field communication.

In some implementations, the first lead terminal 33 and the second lead terminal 34 may be both disposed on the first surface of the second base 20. In such case, to facilitate the first lead terminal 33 and the second lead terminal 34 to be connected to the control circuit, the first lead terminal 33 and the second lead terminal 34 may be disposed over a skipping layer, that is, an interlayer dielectric layer is formed on a side of the second wire 32 away from the first surface. The second end of the first wire 31 is electrically connected to the first lead terminal 33 through a first connection via penetrating through the interlayer dielectric layer, and the second end of the second wire 32 is connected to the second lead terminal 34 through a second connection via penetrating through the interlayer dielectric layer. Obviously, the first lead terminal 33 and the second lead terminal 34 may be disposed on the second surface of the second base 20. In such case, the second end of the first wire 31 is electrically connected to the first lead terminal 33 through a first connection via penetrating through the second base 20, and the second end of the second wire 32 is connected to the second lead terminal 34 through a second connection via penetrating through the second base 20. In both cases above, both the first lead terminal 33 and the second lead terminal 34 may extend in a same direction, thereby facilitating the first lead terminal 33 and the second lead terminal 34 to be connected to the control circuit.

As shown in FIG. 3a, the first wire 31 may have an open-loop structure, the second wire 32 may have a spiral structure, and when the flexible printed circuit board 2 is folded to the back side of the display panel, the first wire 31 and the second wire 32 form one turn of a coil in the near field communication antenna. It should be noted that although the first wire 31 in FIG. 3a has an open-loop structure, actually, the first wire 31 may have a spiral structure disposed around the display region Q1, and in such case, at least one of the first end and the second end of the first wire 31 needs to extend toward the flexible printed circuit board 2 through a skipping layer, so as to avoid any short circuit problem. For example, the first end of the first wire 31 may be in a middle of the first wire 31, an interlayer dielectric layer is formed on a side of the first wire 31 away from the first base 10, and the first end of the first wire 31 extends toward the flexible printed circuit board 2 through a via penetrating through the interlayer dielectric layer.

In some implementations, the display substrate 1 further has a first bonding region Q3 on a side of the peripheral region Q2 away from the display region Q1; the chip on film adapter board 4 includes a second bonding region and a third bonding region; the flexible printed circuit board 2 includes a fourth bonding region; a first connection pad 41 and a second connection pad 42 are provided in the first bonding region Q3; a third connection pad 51 and a fourth connection pad 52 are provided in the second bonding region; a fifth connection pad 61 and a sixth connection pad 62 are provided in the third bonding region; and a seventh connection pad 71 and an eighth connection pad 72 are provided in the fourth bonding region. A first end of the first wire 31 of the near field communication antenna is connected to the first connection pad 41, and the first connection pad 41 is bonded with and connected to the third connection pad 51 by anisotropic conductive film (ACF) adhesive; the second connection pad 42 is connected to the fifth connection pad 61 through a first connection lead 401; the first end of the second wire 32 is connected to the seventh connection pad 71 which is bonded with and connected to the fifth connection pad 61 by ACF adhesive; the second end of the first wire 31 is connected to the second connection pad 42 which is bonded with and connected to the fourth connection pad 52 by ACF adhesive; the fourth connection pad 52 is connected to the sixth connection pad 62 through a second connection lead 402; and the sixth connection pad 62 is bonded with and connected to the eighth connection pad 72 by ACF adhesive, and the eighth connection pad 72 is connected to the first lead terminal 33.

In some implementations, after the first connection pad 41 is bonded with and connected to the third connection pad 51, the fifth connection pad 61 is bonded with and connected to the seventh connection pad 71, the second connection pad 42 is bonded with and connected to the fourth connection pad 52, and the sixth connection pad 62 is bonded with and connected after to the eighth connection pad 72, ultraviolet rays (UV) curing adhesive may be further used for securing purposes, thereby ensuring reliable connections between the first connection pad 41 and the third connection pad 51, between the fifth connection pad 61 and the seventh connection pad 71, between the second connection pad 42 and the fourth connection pad 52, and between the sixth connection pad 62 and the eighth connection pad 72.

In some implementations, the second wire 32 on the flexible printed circuit board 2 is formed of a material including, but not limited to, copper. The material of copper is selected because the copper has relatively good conductivity and relatively small impedance. In some implementations, the second wire 32 has a thickness ranging from about 15 μm to about 35 μm, and a line width ranging from about 100 μm to about 5 mm.

In some implementations, in order to prevent a too small distance between the second wire 32 and a rear case of the display module after the flexible printed circuit board 2 is folded from affecting the performance of the near field communication antenna, a magnetic material layer (not shown in the figures) is disposed on a side of the second wire 32 away from the second surface. In the embodiment of the present disclosure, the magnetic material layer is provided to enhance a magnetic flux of the near field communication antenna. In some implementations, the magnetic material layer is made of a material including, but not limited to, a magnetic material such as ferrite.

In some implementations, the display substrate 1 further includes a metal layer disposed on the first base 10, and the metal layer includes a first part in the display region Q1 and a second part in the peripheral region Q2, and the second part includes the first wire 31 of the near field communication antenna. That is, the first wire 31 of the near field communication antenna and the structure of the display substrate 1 in the display region Q1 may be prepared in a single process, and thus, there is no increase in process and cost.

Further, the first wire 31 of the near field communication antenna may have a single-layer structure or a multi-layer structure, and the embodiment of the present disclosure is illustrated by taking the first wire 31 including a two-layer structure as an example. In other words, the first wire 31 includes a first conductive sub-wire and a second conductive sub-wire which are arranged in a stack. The metal layer in the display substrate 1 includes at least a first metal layer and a second metal layer which are arranged in a stack. For example, as shown in FIG. 4, the first metal layer includes a first conductive sub-wire 311 of the first wire 31 and the gate line GL. That is, the first conductive sub-wire 311 of the first wire 31 and the gate line GL are disposed in a same layer and made of a same material, and may be prepared in a single process, and thus there is no increase in process and cost. The second metal layer includes a second conductive sub-wire 312 of the first wire 31 and the data line DL. That is, the second conductive sub-wire 312 of the first wire 31 and the data line DL are disposed in a same layer and made of a same material, and may be prepared in a single process, and thus there is no increase in process and cost. It should be noted that an insulation layer 13 is disposed at an intersection of the data line DL and the gate line GL and between the data line DL and the gate line GL to avoid a short circuit between the data line DL and the gate line GL. The first metal layer and the second metal layer each may be formed of a material including, but not limited to, at least one of molybdenum, molybdenum-niobium alloy, aluminum, aluminum-neodymium alloy, titanium or copper.

It should be noted that, in the embodiment of the present disclosure, the expression "disposed in a same layer" does not means that structures are disposed in a same layer in a macroscopic sense, but that the structures are formed by a single patterning process.

In some implementations, the first wire 31, either having a single-layer structure or a multi-layer structure, has a thickness ranging from about 2 μm to about 5 μm, and a line width ranging from about 3 μm to about 10 μm. The specific thickness and line width of the first wire 31 may be specifically set according to performance parameters of the near field communication antenna.

Figure 6A:
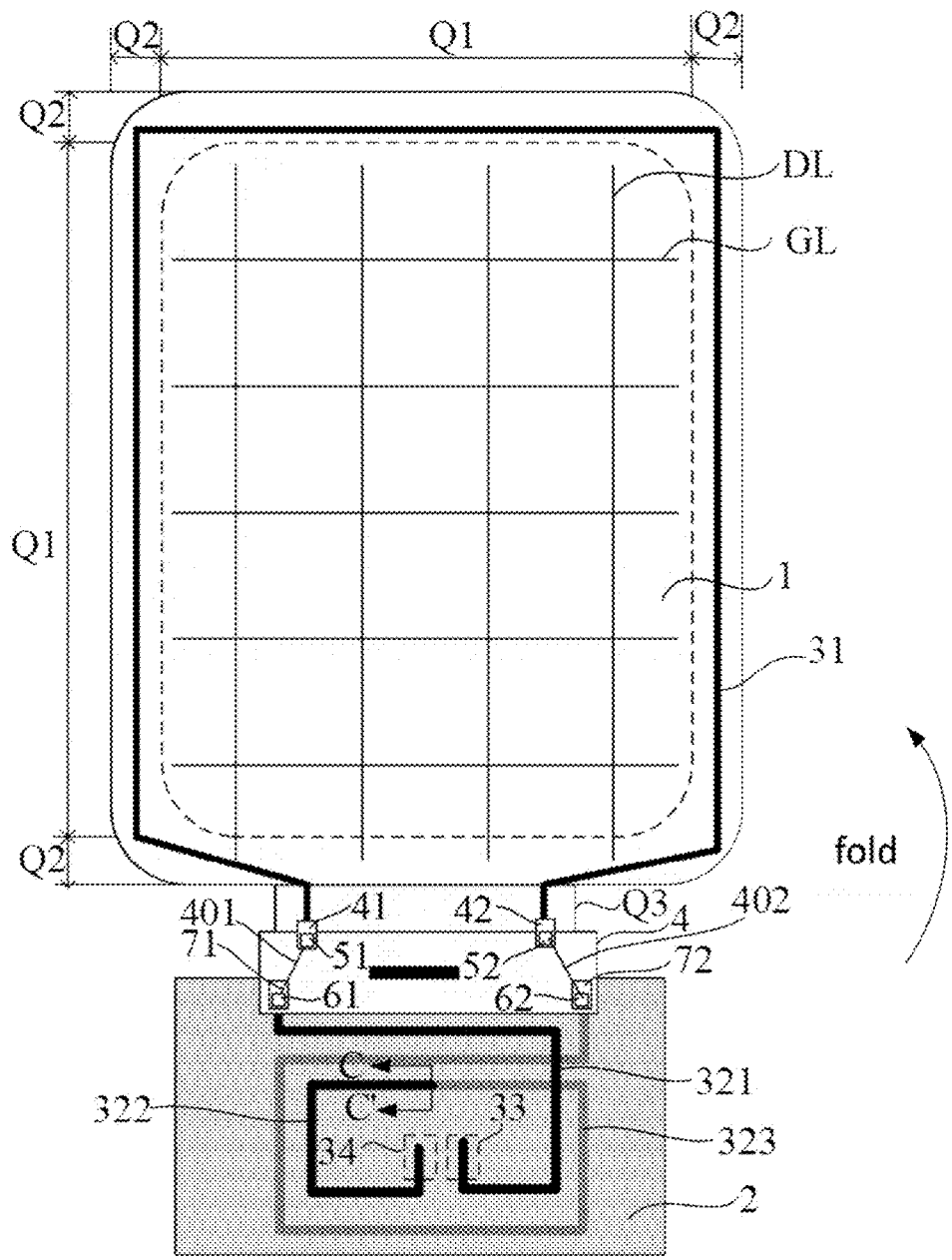
FIG. 6a is a top view of a display module according to an embodiment of the present disclosure with a flexible circuit board unfolded.
Figure 6B:
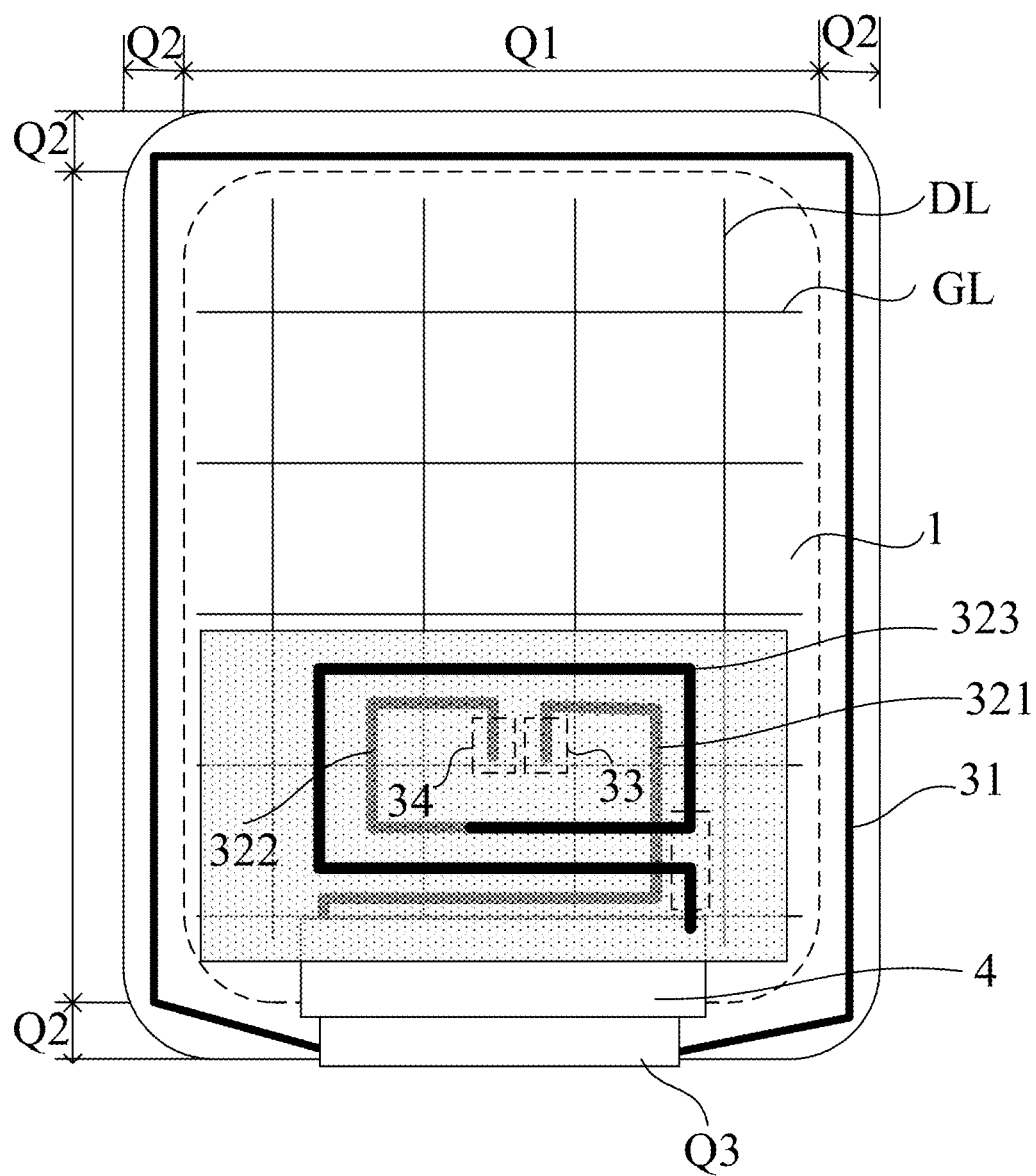
FIG. 6b is a top view of a display module according to an embodiment of the present disclosure with a flexible circuit board folded.
Figure 7:
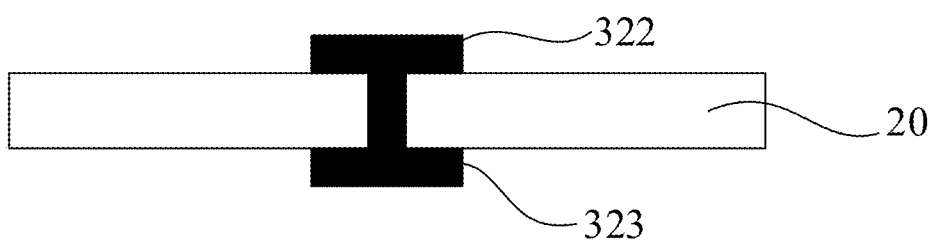

In a second example, FIG. 6a is a top view of a display module according to an embodiment of the present disclosure with a flexible circuit board unfolded; FIG. 6b is a top view of a display module according to an embodiment of the present disclosure with a flexible circuit board folded; and FIG. 7 is a cross-sectional view taken along C-C' of FIG. 6a. As shown in FIGS. 6a, 6b and 7, the display module has substantially the same structure as that in the first example, except that the second wire 32 of the near field communication antenna in the display module is different. The second base 20 includes a first surface and a second surface which are opposite to each other; the second wire 32 includes a first sub-wire 321 and a second sub-wire 322 located on the first surface, and a third sub-wire 323 on the second surface. The near field communication antenna further includes a first lead terminal 33 and a second lead terminal 34 disposed on the flexible printed circuit board 2; the first end of the first wire 31 is connected to a first end of the first sub-wire 321; the second end of the first wire 31 is connected to a first end of the third sub-wire 323 through a first via penetrating through the second base 20; and a second end of the third sub-wire 323 is connected to a first end of the second sub-wire 322 through a second via penetrating through the second base 20. A second end of the first sub-wire 321 serves as the first lead terminal 33; and a second end of the second sub-wire 322 serves as the second lead terminal 34.

In the embodiment of the present disclosure, since the near field communication antenna is integrated in the peripheral region Q2 of the display substrate 1 and on the flexible printed circuit board 2 of the display module, an integrated design of the near field communication antenna and the display module is achieved and no separate near field communication antenna is needed, thereby effectively saving the space occupied by the near field communication antenna, and facilitating a lightweight design of the display module. Moreover, in the embodiment of the present disclosure, a part of wires of the near field communication antenna are integrated on the first surface and the second surface of the flexible printed circuit board 2 that typically includes wires in a single layer, that is, a driving chip and signal lines are both disposed on the first surface of the second base 20 of the flexible circuit board, there is generally no wiring on the second surface of the second base 20, and thus there is enough space on the second surface of the second base 20 to form a coil structure, thereby, in the embodiment of the present disclosure, a part of wires (e.g., the third sub-wire 323) of the near field communication antenna is disposed on the second surface of the second base 20, which may effectively prevent interference between the wires of the near field communication antenna and the signal lines, the driving chip, or the like on the flexible printed circuit board 2.

It should be noted that, the structure of the first wire 31 in this example is the same as the structure of the first wire 31 described above, and therefore, the structure and parameters of the first wire 31 are not repeated here.

In some implementations, the first sub-wire 321, the second sub-wire 322 and the third sub-wire 323 of the second wire 32 have a same line width and a same thickness, which are the same as the line width and thickness of the second wire 32 shown in FIG. 3a, and thus are not repeated here.

In some implementations, the first wire 31, the first sub-wire 321, the second sub-wire 322, and the third sub-wire 323 of the near field communication antenna may form a single turn of coil, or may form multiple turns of coil. In the embodiment of the present disclosure, a near field communication antenna with three turns of coil being formed when the flexible printed circuit board 2 is folded to the back side of the display panel is taken as an example. The first wire 31 has an open-loop structure, which is the same as shown in FIG. 3b and thus is not repeated here. An orthographic projection of the third sub-wire 323 on the second base 20 encloses into a coil structure, orthographic projections of the first sub-wire 321 and the third sub-wire 323 on the second base 20 enclose into a coil structure, and when the flexible printed circuit board 2 is folded to the back side of the display panel, the first wire 31, the first sub-wire 321, the second sub-wire 322 and the third sub-wire 323 form three turns of coil. Obviously, the first wire 31, the first sub-wire 321, the second sub-wire 322, and the third sub-wire 323 may be wound to form a near field communication antenna having more turns of coil, which are not enumerated here.

In some implementations, when the flexible printed circuit board 2 is folded to the back side of the display panel, orthographic projections of the first sub-wire 321, the second sub-wire 322 and the third sub-wire 323 of the near field communication antenna on the first base 10 are located within a range defined by an orthographic projection of the first wire 31 on the first base 10. For example, referring to FIG. 6b, in a case where the first wire 31 has an open-loop structure, orthographic projections of the first sub-wire 321, the second sub-wire 322 and the third sub-wire 323 on the first base 10 are located in an orthographic projection of the first wire 31, having the open-loop structure, on the first base 10. That is, the first wire 31, the first sub-wire 321, the second sub-wire 322 and the third sub-wire 323 are arranged in series to form three turns of coil which are sequentially nested.

In some implementations, when the flexible printed circuit board 2 is folded to the back side of the display panel, orthographic projections of the first sub-wire 321 and the second sub-wire 322 of the near field communication antenna on the second base 20 are located on an orthographic projection of the third sub-wire 323 on the second base 20. In this case, more turns of coil can be formed in a limited wiring space, so as to enhance communication performance of the near field communication antenna.

In some implementations, in the near field communication antenna of the embodiment of the present disclosure, a magnetic material layer is disposed on a side of the first sub-wire 321 and the second sub-wire 322 away from the first surface; and/or a magnetic material layer is disposed on a side of the third sub-wire 323 away from the second surface. For example, in addition to the above structures, the display module further includes a rear case secured to a side of the flexible circuit board away from an array substrate. When the flexible printed circuit board 2 is folded to the back side of the display panel, if a distance between the flexible printed circuit board 2 and the display panel is less than a preset value, a magnetic material layer is disposed on a side of the third sub-wire 323 away from the second surface; and if a distance between the flexible printed circuit board 2 and the rear case is less than a preset value, a magnetic material layer is disposed on a side of the first sub-wire 321 and the second sub-wire 322 away from the first surface. In the embodiment of the present disclosure, the magnetic material layer is provided to enhance a magnetic flux of the near field communication antenna. In some implementations, the magnetic material layer is made of a material including, but not limited to, a magnetic material such as ferrite.

In some implementations, the display substrate 1 further has a first bonding region Q3 on a side of the peripheral region Q2 away from the display region Q1; the chip on film adapter board 4 includes a second bonding region and a third bonding region; the flexible printed circuit board 2 includes a fourth bonding region; a first connection pad 41 and a second connection pad 42 are provided in the first bonding region Q3; a third connection pad 51 and a fourth connection pad 52 are provided in the second bonding region; a fifth connection pad 61 and a sixth connection pad 62 are provided in the third bonding region; and a seventh connection pad 71 and an eighth connection pad 72 are provided in the fourth bonding region. The first end of the first wire 31 is connected to the first connection pad 41 which is bonded with and connected to the third connection pad 51 by ACF adhesive; the third connection pad 51 is connected to the fifth connection pad 61 through a first connection lead 401; the first end of the first sub-wire 321 is connected to the seventh connection pad 71 which is bonded with and connected to the fifth connection pad 61 by ACF adhesive; the second end of the first wire 31 is connected to the second connection pad 42 which is bonded with and connected to the fourth connection pad 52; the fourth connection pad 52 is connected to the sixth connection pad 62 through a second connection lead 402; and the sixth connection pad 62 is bonded with and connected to the eighth connection pad 72 by ACF adhesive, and the eighth connection pad 72 is connected to a first end of the third sub-wire 323 through a first via penetrating through the second base 20.

In some implementations, after the first connection pad 41 is bonded with and connected to the third connection pad 51, the fifth connection pad 61 is bonded with and connected to the seventh connection pad 71, the second connection pad 42 is bonded with and connected to the fourth connection pad 52, and the sixth connection pad 62 is bonded with and connected after to the eighth connection pad 72, UV curing adhesive may be further used for securing purposes, thereby ensuring reliable connections between the first connection pad 41 and the third connection pad 51, between the fifth connection pad 61 and the seventh connection pad 71, between the second connection pad 42 and the fourth connection pad 52, and between the sixth connection pad 62 and the eighth connection pad 72.

Figure 8:
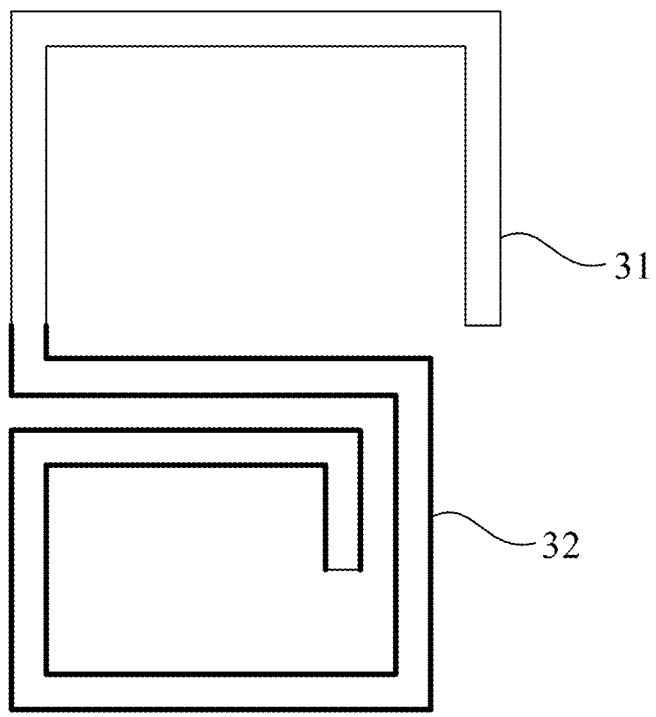
FIG. 8 is a schematic diagram of a near field communication antenna being unfolded according to an embodiment of the present disclosure.
Figure 9:
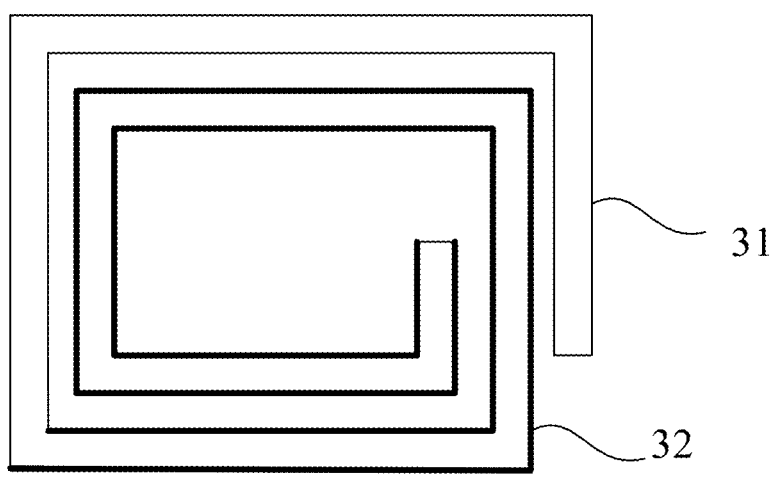
FIG. 9 is a schematic diagram of a near field communication antenna being folded according to an embodiment of the present disclosure.

Either in the first example or in the second example, the description is made by taking the near field communication antenna including one first wire 31 and one second wire 32 as an example. In some implementations, as shown in FIGS. 8 and 9, FIG. 9 is a schematic diagram of the near field communication antenna of FIG. 8 after being folded; there may be a plurality of first wires 31 and a plurality of second wires 32 provided in the near field communication antenna, in such case, each of the first wires 31 is connected to one of the second wires 32 in series, so that a group of sub-coils is formed, and the sub-coils are connected in parallel and each have a first end connected to the first lead terminal 33, and a second end connected to the second lead terminal 34. In this manner, a total impedance of the coil of the near field communication antenna can be reduced. For example, the number of the first wires 31 and the number of the second wires 32 may be set according to the number of connection pads that can be provided in the first bonding region Q3, the second bonding region, the third bonding region, and the fourth bonding region, and in an implementation, the number of the first wires 31 and the number of the second wires 32 each are four.

It should be noted that FIGS. 8 and 9 are merely schematic diagrams of connections of the first wires 31 and the second wires 32, and the number of the first wires 31 and the number of the second wires 32, as well as a shape of the sub-coil formed, are not limited in the embodiment of the present disclosure.

An embodiment of the present disclosure provides an electronic device. The electronic device may include any one of the above display modules, which may be an organic electroluminescent diode display module.

The electronic device provided in the embodiment of the present disclosure may be a wearable device, such as a watch. Apparently, the display device may also be a mobile phone, a tablet PC, a television, a monitor, a notebook computer, a digital album, a navigator or any other product or component having a display function.

In the electronic device provided in the embodiment of the present disclosure, by integrating the near field communication antenna on the display substrate 1 and the flexible printed circuit board 2 of the display module, an integrated design of the near field communication antenna and the display module is achieved, which is beneficial to saving space and obtaining a lightweight design of the display module.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display module, comprising a display substrate, a flexible printed circuit board, and a near field communication antenna; wherein
the display substrate has a display region and a peripheral region; and at least a part of structure of the near field communication antenna is located in the peripheral region of the display substrate and on the flexible printed circuit board,
wherein the display substrate comprises a first base; the flexible printed circuit board comprises a second base; the near field communication antenna comprises a first wire and a second wire which are electrically connected; the first wire is located in the peripheral region and disposed on the first base; and the second wire is disposed on the second base,
the display module further comprises an adapter board, and the first wire is electrically connected to the second wire through the adapter board.

2. The display module according to claim 1, wherein the adapter board comprises a chip on film adapter board.

3. The display module according to claim 1, wherein the near field communication antenna further comprises a first lead terminal and a second lead terminal on the flexible printed circuit board; the second base comprises a first surface and a second surface which are opposite to each other; the second wire is disposed on the first surface; a first end of the first wire is connected to a first end of the second wire; a second end of the first wire is connected to the first lead terminal; and a second end of the second wire is connected to the second lead terminal.

4. The display module according to claim 3, wherein the display substrate further has a first bonding region on a side of the peripheral region away from the display region; the adapter board comprises a second bonding region and a third bonding region; and the flexible printed circuit board comprises a fourth bonding region;
a first connection pad and a second connection pad are provided in the first bonding region; a third connection pad and a fourth connection pad are provided in the second bonding region; a fifth connection pad and a sixth connection pad are provided in the third bonding region; and a seventh connection pad and an eighth connection pad are provided in the fourth bonding region;
the first end of the first wire is connected to the first connection pad which is bonded with and connected to the third connection pad; the third connection pad is connected to the fifth connection pad through a first connection lead; and the first end of the second wire is connected to the seventh connection pad which is bonded with and connected to the fifth connection pad; and
the second end of the first wire is connected to the second connection pad which is bonded with and connected to the fourth connection pad; the fourth connection pad is connected to the sixth connection pad through a second connection lead; and the sixth connection pad is bonded with and connected to the eighth connection pad which is connected to the first lead terminal.

5. The display module according to claim 3, wherein a magnetic material layer is disposed on a side of the second wire away from the first surface; and the magnetic material layer covers the second wire.

6. The display module according to claim 3, wherein the first lead terminal and the second lead terminal extend in a same direction.

7. The display module according to claim 1, wherein the second base comprises a first surface and a second surface which are opposite to each other; the second wire comprises a first sub-wire and a second sub-wire on the first surface, and a third sub-wire on the second surface; and the near field communication antenna further comprises a first lead terminal and a second lead terminal on the flexible printed circuit board;
a first end of the first wire is connected to a first end of the first sub-wire; a second end of the first wire is connected to a first end of the third sub-wire through a first via penetrating through the second base; a second end of the third sub-wire is connected to a first end of the second sub-wire through a second via penetrating through the second base; a second end of the first sub-wire serves as the first lead terminal; and a second end of the second sub-wire serves as the second lead terminal.

8. The display module according to claim 7, wherein the display substrate further has a first bonding region on a side of the peripheral region away from the display region; the adapter board comprises a second bonding region and a third bonding region; and the flexible printed circuit board comprises a fourth bonding region;
a first connection pad and a second connection pad are provided in the first bonding region; a third connection pad and a fourth connection pad are provided in the second bonding region; a fifth connection pad and a sixth connection pad are provided in the third bonding region; and a seventh connection pad and an eighth connection pad are provided in the fourth bonding region;
the first end of the first wire is connected to the first connection pad which is bonded with and connected to the third connection pad; the third connection pad is connected to the fifth connection pad through a first connection lead; and the first end of the first sub-wire is connected to the seventh connection pad which is bonded with and connected to the fifth connection pad; and
the second end of the first wire is connected to the second connection pad which is bonded with and connected to the fourth connection pad; the fourth connection pad is connected to the sixth connection pad through a second connection lead; and the sixth connection pad is bonded with and connected to the eighth connection pad which is connected to the first end of the third sub-wire through a first via penetrating through the second base.

9. The display substrate according to claim 7, wherein orthographic projections of the first sub-wire and the second sub-wire on the second base overlap an orthographic projection of the third sub-wire on the second base.

10. The display substrate according to claim 7, wherein a magnetic material layer is disposed on a side of the first sub-wire and the second sub-wire away from the first surface; and the magnetic material layer covers the first sub-wire and the second sub-wire; and/or
a magnetic material layer is disposed on a side of the third sub-wire away from the second surface; and the magnetic material layer covers the third sub-wire.

11. The display module according to claim 7, wherein the first lead terminal and the second lead terminal extend in a same direction.

12. The display module according to claim 1, wherein the near field communication antenna comprises a plurality of first wires and a plurality of second wires, and each of the first wires is connected to one of the second wires so that a group of sub-coils is formed, the sub-coils are connected in parallel and each has a first end connected to the first lead terminal, and a second end connected to the second lead terminal.

13. The display module according to claim 1, wherein the display substrate further comprises a metal layer on the first base; in a plane parallel to a plane where the first base is located, the metal layer comprises a first part in the display region and a second part in the peripheral region; and the second part comprises the first wire.

14. The display module according to claim 13, wherein, in a direction perpendicular to the plane where the first base is located, the metal layer comprises a first metal layer and a second metal layer; the first wire comprises a first conductive sub-wire and a second conductive sub-wire which are arranged in a stack and electrically connected;

the first metal layer comprises a gate line in the display region and the first conductive sub-wire; and the second metal layer comprises a data line in the display region and the second conductive sub-wire.

15. A display device, comprising a display module according to claim 1.

* * * * *